US012796303B2

(12) United States Patent
Lee et al.

(10) Patent No.: US 12,796,303 B2
(45) Date of Patent: Nov. 10, 2026

(54) DISPLAY DEVICE AND A METHOD OF MANUFACTURING THE SAME

(71) Applicant: Samsung Display Co., Ltd., Yongin-si (KR)

(72) Inventors: Dong-Hoon Lee, Yongin-si (KR); Hyunjoon Kim, Yongin-si (KR); Gyungsoon Park, Yongin-si (KR); Sunhwa Lee, Yongin-si (KR); Seon Young Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 405 days.

(21) Appl. No.: 18/509,172

(22) Filed: Nov. 14, 2023

(65) Prior Publication Data

US 2024/0260440 A1 Aug. 1, 2024

(30) Foreign Application Priority Data

Jan. 30, 2023 (KR) ........................ 10-2023-0011937

(51) Int. Cl.

| | |
|---|---|
| ***H10K 59/88*** | (2023.01) |
| ***H10K 59/122*** | (2023.01) |
| ***H10K 71/00*** | (2023.01) |
| ***H10K 71/60*** | (2023.01) |

(52) U.S. Cl.

CPC ............. *H10K 59/88* (2023.02); *H10K 71/60* (2023.02); *H10K 71/621* (2023.02); *H10K 59/122* (2023.02)

(58) Field of Classification Search

CPC ... H10H 20/821; H10H 20/816; H10W 90/00; H05B 33/10; H05B 33/12

See application file for complete search history.

(56) References Cited

U.S. PATENT DOCUMENTS

| | | | | |
|---|---|---|---|---|
| 7,592,635 | B2 * | 9/2009 | Chung | H10K 59/122 257/59 |
| 8,487,301 | B2 * | 7/2013 | Choi | H10K 59/122 313/500 |
| 9,437,843 | B2 * | 9/2016 | Suh | H10K 59/122 |
| 11,222,936 | B2 * | 1/2022 | Jeong | H10K 59/35 |
| 11,348,983 | B1 | 5/2022 | Choung et al. | |
| 11,569,314 | B2 * | 1/2023 | Yang | H10K 71/233 |
| 12,593,568 | B2 * | 3/2026 | Lee | H10K 59/122 |
| 2013/0248867 | A1 * | 9/2013 | Kim | H10K 59/122 438/34 |
| 2018/0033847 | A1 | 2/2018 | Kim et al. | |

(Continued)

FOREIGN PATENT DOCUMENTS

| | | |
|---|---|---|
| KR | 10-2018-0013577 A | 2/2018 |
| KR | 10-2020-0046196 A | 5/2020 |
| WO | WO 2022/039890 | 2/2022 |

*Primary Examiner* — Mary Ellen Bowman

(74) *Attorney, Agent, or Firm* — Womble Bond Dickinson (US) LLP

(57) ABSTRACT

A display device includes a conductive pattern, an overhang layer pattern, an organic layer, and a second electrode. A width of a top surface of the overhang layer pattern is greater than a width of a top surface of the conductive pattern. The display device disconnects the organic layer by including the overhang layer pattern serving as a tip, and the display device includes a second electrode contacting sidewalls of the conductive pattern to be connected over an entirety of a panel.

20 Claims, 7 Drawing Sheets

(56) References Cited

U.S. PATENT DOCUMENTS

| | | | | |
|---|---|---|---|---|
| 2020/0127242 | A1 | 4/2020 | Yang et al. | |
| 2020/0161394 | A1* | 5/2020 | Jeon | H10K 59/122 |
| 2021/0167146 | A1* | 6/2021 | Yang | H10K 59/30 |
| 2022/0077257 | A1 | 3/2022 | Choung et al. | |
| 2024/0321837 | A1* | 9/2024 | Park | H10H 20/833 |
| 2024/0334745 | A1* | 10/2024 | Lee | H10K 59/122 |
| 2025/0185466 | A1* | 6/2025 | Yoo | H10K 59/873 |

* cited by examiner

DISPLAY DEVICE AND A METHOD OF MANUFACTURING THE SAME

CROSS-REFERENCE TO RELATED APPLICATION

This application claims priority to, and the benefit of, Korean Patent Application No. 10-2023-0011937, filed on Jan. 30, 2023, in the Korean Intellectual Property Office (KIPO), the entire contents of which are incorporated herein by reference.

BACKGROUND

1. Field

Embodiments relate to a display device, and to a method of manufacturing the display device.

2. Description of the Related Art

With the development of information technology, the importance of display devices, which are the connection medium between users and information, is emerging. Accordingly, the use of display devices, such as liquid crystal display devices (LCDs), organic light emitting display devices (OLEDs), plasma display devices (PDPs), and the like, is increasing.

An image of the display device may be realized by a combination of light emitted from pixels. A fine metal mask (FMM) method, which is one of the pixel formation methods, is a method of forming the pixels by aligning a mask and a substrate in a vacuum chamber, and depositing organic material only in a desired area. According to the FMM method, due to a frame of the mask, a minimum gap between pixel-defining layers defining the pixels may be about 20 micrometers (um). For this reason, the FMM method has a limitation in manufacturing a high-resolution display device.

On the other hand, to use the FMM method, a spacer may be located on the substrate to support the mask. When a distance between the spacer and the pixel is insufficient due to a stamping phenomenon, a dark spot may occur in the display device. As a result, a quality of the display device may deteriorate.

SUMMARY

Embodiments provide a display device with high resolution.

Embodiments provide a method of manufacturing the display device.

A display device according to one or more embodiments of the disclosure includes a first electrode above a substrate, a pixel-defining layer above the substrate, defining an opening exposing a portion of a top surface of the first electrode, having a top surface having a first width, and including an inorganic material, a conductive pattern above the pixel-defining layer, having a first thickness, and having a top surface having a second width that is less than the first width, an overhang layer pattern above the conductive pattern, having a second thickness that is different from the first thickness, and having a top surface having a third width that is greater than the first width, an organic layer including a first portion in contact with the top surface of the overhang layer pattern, and a second portion in contact with both the first electrode and the pixel-defining layer, and a second electrode including a third portion in contact with the top surface of the first portion of the organic layer, and a fourth portion spaced apart from the third portion and in contact with both the top surface of the second portion of the organic layer and opposite sides of the conductive pattern.

The second thickness may be less than the first thickness.

The display device may further include a protective pattern between the conductive pattern and the overhang layer pattern, and including a second metal that is different from a first metal of the conductive pattern.

The first metal may include aluminum (Al), and the second metal may include titanium (Ti).

A taper angle of the conductive pattern may be substantially equal to a taper angle of the protective pattern.

The overhang layer pattern may include an inorganic material.

The overhang layer pattern may include a metal.

The overhang layer pattern may include a multi-layer structure including a first layer including an inorganic material, and a second layer including a metal.

A method of manufacturing the display device according to one or more other embodiments of the disclosure includes forming a first electrode above a substrate, forming a pixel-defining layer above the substrate, the pixel-defining layer defining an opening exposing a portion of a top surface of the first electrode, having a top surface having a first width, and including an inorganic material, forming a conductive layer above the pixel-defining layer, forming a conductive pattern having a first thickness, and having a top surface having a second width that is less than the first width by patterning the conductive layer, forming a sacrificial layer including an organic material above the conductive layer, planarizing the sacrificial layer, forming a preliminary overhang layer having a second thickness that is different from the first thickness above the sacrificial layer, forming an overhang layer pattern having a top surface having a third width that is greater than the first width by patterning the preliminary overhang layer, removing the sacrificial layer, forming an organic layer including a first portion in contact with a top surface of the overhang layer pattern, and a second portion in contact with both the first electrode and the pixel-defining layer, and forming a second electrode including a third portion in contact with the top surface of the first portion of the organic layer, and a fourth portion spaced apart from the third portion and in contact with both the top surface of the second portion of the organic layer and opposite sides of the conductive pattern.

The second thickness may be less than the first thickness.

The method may further include, prior to the forming the conductive pattern, forming a protective layer above the conductive layer, the protective layer including a second metal that is different from a first metal of the conductive pattern.

The first metal may include aluminum (Al), and the second metal may include titanium (Ti).

The protective layer and the conductive layer may be patterned through a dry etching process concurrently or substantially simultaneously.

The sacrificial layer may include photoresist.

The preliminary overhang layer may include at least one selected from a group consisting of an inorganic material and/or a metal.

The preliminary overhang layer may include a multi-layer structure having a first layer including an inorganic material, and a second layer including a metal.

The sacrificial layer may be planarized through a process of one of a chemical mechanical polishing (CMP) process, and a photolithography process.

The preliminary overhang layer may be patterned through a dry etching process.

The sacrificial layer may be removed through an ashing process.

The first electrode may include an anode, wherein the second electrode includes a cathode resulting from a sputtering process.

In a display device according to embodiments of the disclosure, a display device may include an overhang layer pattern having a width that is greater than a width of a top surface of a conductive pattern. The overhang layer pattern may disconnect an organic layer as a tip, and a second electrode may be connected to opposite sides of the conductive pattern.

In a method of manufacturing the display device according to embodiments of the disclosure, the method may include forming a sacrificial layer including an organic material, forming an overhang layer pattern, and then removing the sacrificial layer. When forming of the overhang layer pattern, by using the sacrificial layer instead using wet etching, a gap between pixel-defining layers may be reduced of about 3 micrometers, and pixels per inch (PPI) may be increased.

DETAILED DESCRIPTION

Figure 1:
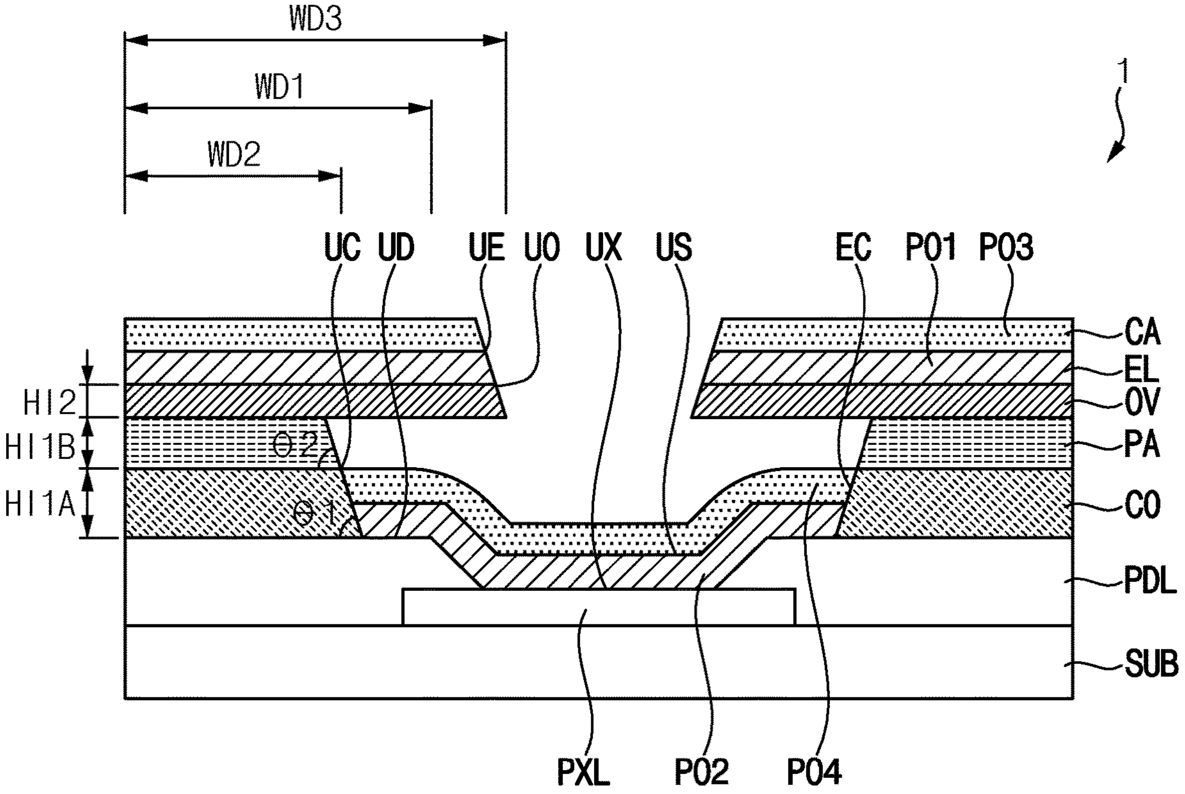
FIG. 1 is a cross-sectional view illustrating a display device according to one or more embodiments of the disclosure.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may have various modifications and may be embodied in different forms, and should not be construed as being limited to only the illustrated embodiments herein. Further, each of the features of the various embodiments of the present disclosure may be combined or combined with each other, in part or in whole, and technically various interlocking and driving are possible. Each embodiment may be implemented independently of each other or may be implemented together in an association. The described embodiments are provided as examples so that this disclosure will be thorough and complete, and will fully convey the aspects of the present disclosure to those skilled in the art, and it should be understood that the present disclosure covers all the modifications, equivalents, and replacements within the idea and technical scope of the present disclosure. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts that are not related to, or that are irrelevant to, the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place.

Thus, the regions illustrated in the drawings are schematic in nature and their shapes are not intended to illustrate the actual shape of a region of a device and are not intended to be limiting. Additionally, as those skilled in the art would realize, the described embodiments may be modified in various ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form to avoid unnecessarily obscuring various embodiments.

Spatially relative terms, such as “beneath,” “below,” “lower,” “lower side,” “under,” “above,” “upper,” “upper side,” and the like, may be used herein for ease of explanation to describe one element or feature’s relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as “below,” “beneath,” “or “under” other elements or features would then be oriented “above” the other elements or features. Thus, the example terms “below” and “under” can encompass both an orientation of above and below. The device may be otherwise oriented (e.g., rotated 90 degrees or at other orientations) and the spatially relative descriptors used herein should be interpreted accordingly. Similarly, when a first part is described as being arranged “on” a second part, this indicates that the first part is arranged at an upper side or a lower side of the second part without the limitation to the upper side thereof on the basis of the gravity direction.

Further, the phrase "in a plan view" means when an object portion is viewed from above, and the phrase "in a schematic cross-sectional view" means when a schematic cross-section taken by vertically cutting an object portion is viewed from the side. The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. The expression "not overlap" may include meaning, such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

It will be understood that when an element, layer, region, or component is referred to as being "formed on," "on," "connected to," or "(operatively or communicatively) coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled," or "directly on," refers to one component directly connecting or coupling another component, or being on another component, without an intermediate component. In addition, in the present specification, when a portion of a layer, a film, an area, a plate, or the like is formed on another portion, a forming direction is not limited to an upper direction but includes forming the portion on a side surface or in a lower direction. On the contrary, when a portion of a layer, a film, an area, a plate, or the like is formed "under" another portion, this includes not only a case where the portion is "directly beneath" another portion but also a case where there is further another portion between the portion and another portion. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," or "any one of," or "one or more of" when preceding a list of elements, modify the entire list of elements and do not modify the individual elements of the list. For example, "at least one of X, Y, and Z," "at least one of X, Y, or Z," "at least one selected from the group consisting of X, Y, and Z," and "at least one selected from the group consisting of X, Y, or Z" may be construed as X only, Y only, Z only, any combination of two or more of X, Y, and Z, such as, for instance, XYZ, XYY, YZ, and ZZ, or any variation thereof. Similarly, the expression such as "at least one of A and B" and "at least one of A or B" may include A, B, or A and B. As used herein, "or" generally means "and/or," and the term "and/or" includes any and all combinations of one or more of the associated listed items. For example, the expression such as "A and/or B" may include A, B, or A and B. Similarly, expressions such as "at least one of," "a plurality of," "one of," and other prepositional phrases, when preceding a list of elements, modify the entire list of elements and do not modify the individual elements of the list.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

The terminology used herein is for the purpose of describing particular embodiments only and is not intended to be limiting of the present disclosure. As used herein, the singular forms "a" and "an" are intended to include the plural forms as well, while the plural forms are also intended to include the singular forms, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

When one or more embodiments may be implemented differently, a specific process order may be performed differently from the described order. For example, two consecutively described processes may be performed substantially at the same time or performed in an order opposite to the described order.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
FIG. 2 is a view illustrating a structure of an overhang layer pattern included in the display device.

FIG. 1 is a cross-sectional view illustrating a display device according to one or more embodiments of the disclosure. FIG. 2 is a view illustrating a structure of an overhang layer pattern included in the display device.

Referring to FIGS. 1 and 2, a display device 1 may include a substrate SUB, a first electrode PXL, a pixel-defining layer PDL, a conductive pattern CO, a protective pattern PA, an overhang layer pattern OV, an organic layer EL, and a second electrode CA.

The substrate SUB may include various materials. For example, the substrate SUB may include a silicon wafer, a glass, a plastic, or the like.

A plurality of pixels may be located on the substrate SUB. Each of the plurality of pixels may include a first sub pixel, a second sub pixel, and a third sub pixel. The first sub pixel, the second sub pixel, and the third sub pixel may be defined as a smallest unit in which light is emitted.

For example, the first sub pixel may emit red light. The second sub pixel may emit green light. The third sub pixel may emit blue light. The display device 1 may emit light of various colors by combining light emitted from one or more of the first sub pixel, the second sub pixel, and/or the third sub pixel.

The first electrode PXL may be located on the substrate SUB. The first electrode PXL may include a conductive material. For example, the first electrode PXL may include indium tin oxide (ITO), indium zinc oxide (IZO), zinc oxide (ZnOx), indium oxide (InOx), or the like. These may be used alone or in combination with each other.

The first electrode PXL may have a mono-layer structure including at least one of the above-described materials. Alternatively, the first electrode PXL may have a multi-layer structure.

The pixel-defining layer PDL may be located on the substrate SUB, and may define an opening (e.g., an opening OS of FIG. 4) exposing a portion of a top surface UX of the first electrode PXL.

The pixel-defining layer PDL may include an inorganic material. For example, the pixel-defining layer PDL may include silicon nitride (SiNx), silicon oxide (SiOx), silicon oxynitride (SixNyOz), magnesium fluoride (MgFx), or the like.

The conductive pattern CO may be located on the pixel-defining layer PDL. The conductive pattern CO may include a conductive material. For example, the conductive pattern CO may include chromium (Cr), titanium (Ti), gold (Au), silver (Ag), aluminum (Al), indium tin oxide (ITO), or the like.

In one or more embodiments, a top surface UC of the conductive pattern CO may have a second width WD2. The second width WD2 may be less than the first width WD1. In other words, a width of the top surface UC of the conductive pattern CO (e.g., the second width WD2) may be less than a width of the top surface UD of the pixel-defining layer PDL (e.g., a first width WD1).

The protective pattern PA may be located between the conductive pattern CO and the overhang layer pattern OV to be described later.

In one or more embodiments, the conductive pattern CO and the protective pattern PA may include different materials. For example, the conductive pattern CO may include a first metal, and the protective pattern PA may include a second metal that is different from the first metal. For example, the first metal may be aluminum (Al), and the second metal may be titanium (Ti). In other words, the protective pattern PA including the titanium may be located on the conductive pattern CO. Accordingly, the protective pattern PA may protect the conductive pattern CO from corrosion.

In one or more embodiments, a taper angle of the conductive pattern CO may be the same as a taper angle of the protective pattern PA. For example, each of the conductive pattern CO and the protective pattern PA may have a regular taper shape. Accordingly, a first angle θ1 between the top surface UD of the pixel-defining layer PDL and opposite sides EC of the conductive pattern CO may be an acute angle.

As described below, the conductive pattern CO and the protective pattern PA may be patterned concurrently or substantially simultaneously. Accordingly, a second angle θ2 between the top surface of the conductive pattern CO and opposite sides of the protective pattern PA may also be an acute angle. In addition, the second angle θ2 may be a same as the first angle θ1.

However, the disclosure is not limited thereto. For example, the protective pattern PA may be omitted.

The overhang layer pattern OV may be located on the conductive pattern CO. For example, when the protective pattern PA is omitted in the display device 1, the overhang layer pattern OV may be located on the conductive pattern CO.

The overhang layer pattern OV may include an inorganic material, a metal, or the like. Examples of inorganic materials may include silicon nitride (SiNx), silicon oxide (SiOx), or the like. Examples of the metal may include titanium (Ti) or the like.

However, the disclosure is not limited thereto. The overhang layer pattern OV may include a material that is resistant to damage that may occur in subsequent processes (e.g., a deposition process to form the organic layer EL, a sputtering process to form the second electrode CA, or the like) without restriction.

The overhang layer pattern OV may have a second thickness HI2.

In one or more embodiments, the second thickness HI2 may be less than a first thickness. Here, the first thickness may be either a first lower thickness HI1A of the conductive pattern CO, or a first upper thickness HI1B of the protective pattern PA. For example, in a cross-sectional view, the first lower thickness HI1A of the conductive pattern CO or the first upper thickness HI1B of the protective pattern PA may be about 2000 angstroms (Å). On the other hand, the second thickness HI2 of the overhang layer pattern OV may be about 1000 Å. As the second thickness HI2 becomes less, the second electrode CA may be more suitably formed. A detailed description will be described in the second electrode CA part.

A top surface UO of the overhang layer pattern OV may have a third thickness WD3. The third thickness WD3 may be greater than the first width WD1. In other words, a width of the top surface UO of the overhang layer pattern OV may be greater than the width of the top surface UD of the pixel-defining layer PDL. Accordingly, the overhang layer pattern OV may serve as a tip (e.g., a tip TP of FIG. 13).

The overhang layer pattern OV may have various structures. In one or more embodiments, as shown in FIG. 1, the overhang layer pattern OV may have the mono-layer structure. As shown in FIG. 2, the overhang layer pattern OV may have the multi-layer structure. For example, the overhang layer pattern OV may include a first inorganic layer OV1, a metal layer OV2, and a second inorganic layer OV3. In this case, the display device may have a more robust structure than a display device including, for example, only the first inorganic layer OV1 or the metal layer OV2.

However, the disclosure is not limited thereto. The overhang layer pattern OV may have various structures including a first layer including the inorganic material, a second layer including metal, or the like.

The organic layer EL may include a first portion PO1, and a second portion PO2 spaced apart from the first portion PO1. The first portion PO1 may be in contact with the top surface UO of the overhang layer pattern OV. The second portion PO2 may be in contact with both the first electrode PXL and the pixel-defining layer PDL. In other words, the first portion PO1 of the organic layer EL and the second portion PO2 of the organic layer EL may have a disconnected structure.

The organic layer EL may include a light-emitting layer and a functional layer. The functional layer may include a hole transport layer, a hole injection layer, an electron injection layer, an electron transport layer, and/or the like. For example, the organic layer EL may include the hole transport layer, the hole injection layer, the light-emitting layer, the electron transport layer, and/or the electron injection layer. However, the disclosure is not limited thereto, and a stacking sequence or stacking formation may be changed.

The second electrode CA may include a third portion PO3 and a fourth portion PO4 spaced apart from the third portion PO3.

The third portion PO3 of the second electrode CA may be in contact with a top surface UE of the first portion PO1 of the organic layer EL. The fourth portion PO4 may be in contact with both a top surface US of the second portion PO2 of the organic layer EL and the opposite sides EC of the conductive pattern CO. The second electrode CA may be connected to an entire panel by contacting the opposite sides EC of the conductive pattern CO. That is, when a voltage (e.g., a panel driving voltage (ELVSS)) is applied to the conductive pattern CO, the voltage may be applied to the organic layer EL through the second electrode CA, which is in contact with the opposite sides EC of the conductive pattern CO.

The second electrode CA may include a transparent conductive material. For example, the second electrode CA may include lithium (Li), calcium (Ca), aluminum (Al), silver (Ag), magnesium (Mg), barium (Ba), or the like. These may be used alone or in combination with each other.

As the second thickness HI2 of the overhang layer pattern OV becomes less, the second electrode CA may be more suitably formed. For example, as the second thickness HI2 become greater, an angle limit at which a material forming the second electrode CA is incident toward the top surface of the organic material layer EL through the overhang layer pattern OV may increase. The angle limit problem may be solved by forming the second thickness HI2 of the overhang layer pattern OV to be less than the first lower thickness HI1A of the conductive pattern CO (or the first upper thickness HI1B of the protective pattern PA).

The display device 1 according to one or more embodiments of the disclosure may include the overhang layer pattern OV acting as the tip. When the display device 1 includes the overhang layer pattern OV acting as the tip, the display device 1 may include the disconnected organic layer EL. The second electrode CA may be connected to the entire panel by side wall contact.

In addition, the display device may solve the deposition angle limit problem by the overhang layer pattern OV being thinner than the conductive pattern CO on the first electrode PXL. By thinning the overhang layer pattern OV, it is possible to widen a range of the angle at which the material capable of forming the second electrode CA may be deposited on the substrate SUB.

FIGS. 3, 4, 5, 6, 7, 8, 9, 10, 11, 12, 13, 14, and 15 are cross-sectional views illustrating a method of manufacturing the display device. Hereinafter, descriptions overlapping those of the display device 1 described above with reference to FIGS. 1 and 2 will be omitted or simplified.

Figure 3:
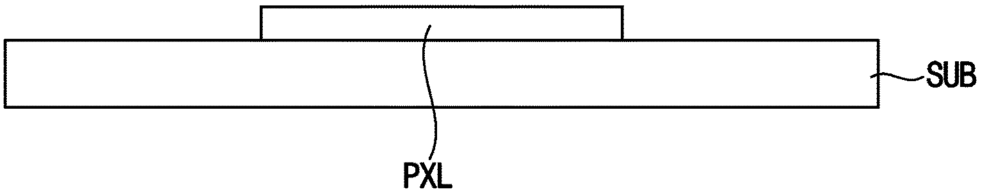
FIGS. 3, 4, 5, 6, 7, 8, 9, 10, 11, 12, 13, 14, and 15 are cross-sectional views illustrating a method of manufacturing the display device.

Referring to FIG. 3, the first electrode PXL may be formed on the substrate SUB.

The substrate SUB may be formed of various materials. For example, the substrate SUB may be formed of silicon wafer, glass, plastic, or the like.

The first electrode PXL may be formed of a conductive material. For example, the first electrode PXL may be formed of indium tin oxide (ITO), indium zinc oxide (IZO), zinc oxide (ZnOx), indium oxide (InOx), or the like. These may be used alone or in combination with each other.

Figure 4:
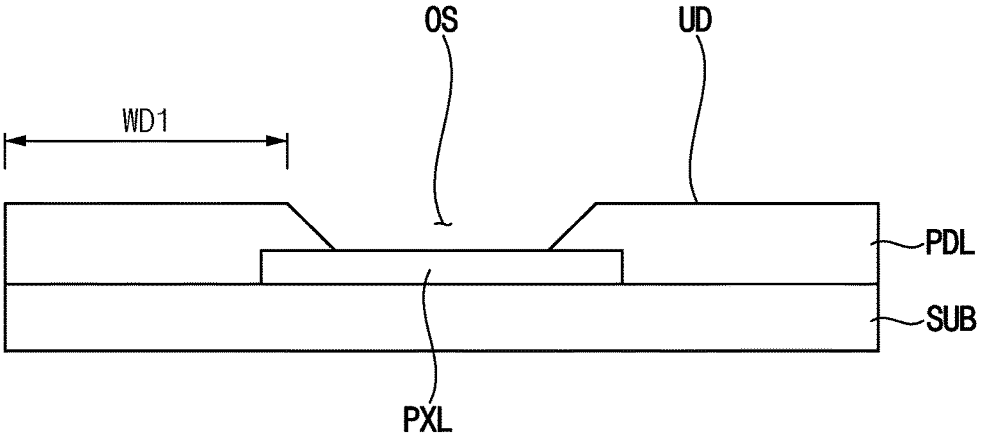

Referring to FIG. 4, the pixel-defining layer PDL may be formed on the substrate SUB. The pixel-defining layer PDL may define the opening OS exposing the portion of the top surface UX of the first electrode PXL. The top surface UD of the pixel-defining layer PDL may have the first width WD1.

The pixel-defining layer PDL may be formed of the inorganic material. For example, the pixel-defining layer PDL may be formed of silicon nitride (SiNx), silicon oxide (SiOx), silicon oxynitride (SixNyOz), magnesium fluoride (MgFx), or the like.

Figure 5:
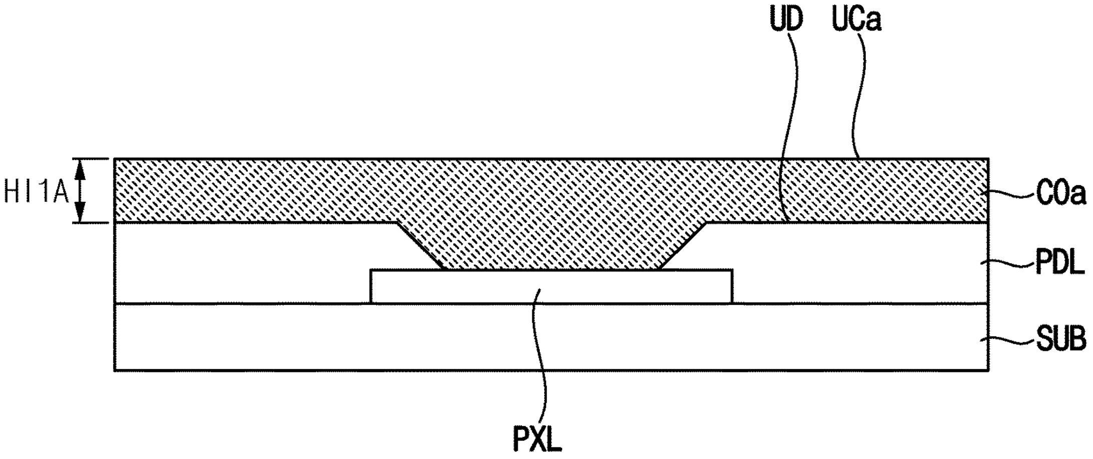
Figure 6:
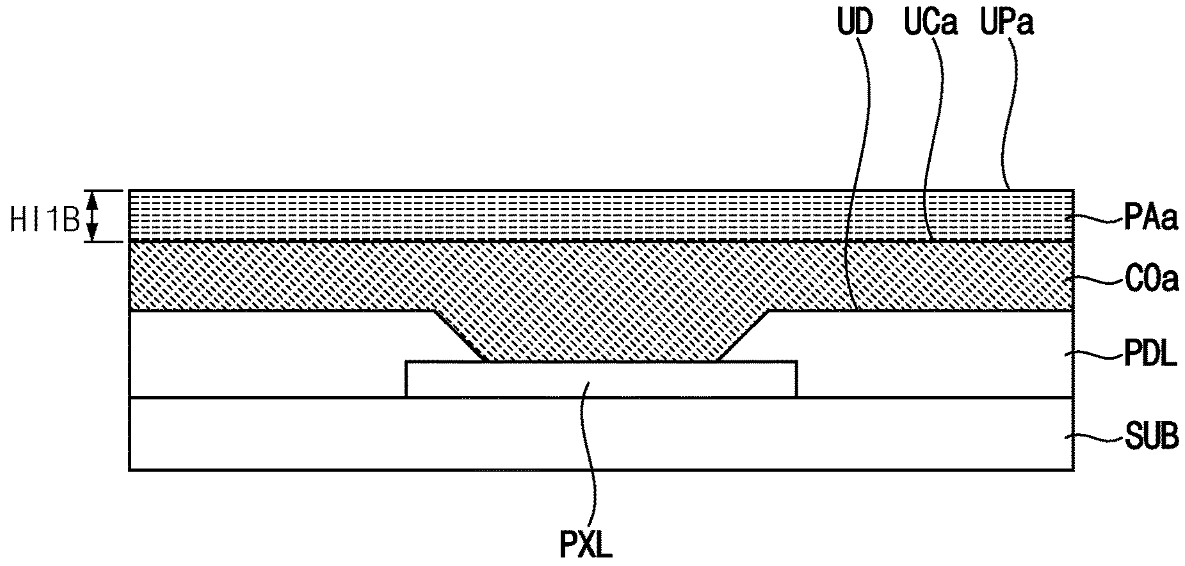

Referring to FIGS. 5 and 6, a conductive layer COa may be formed on the first electrode PXL, and a protective layer PAa may be located on the conductive layer COa.

The conductive layer COa may be formed of a conductive material. For example, the conductive layer COa may include chromium (Cr), titanium (Ti), gold (Au), silver (Ag), aluminum (Al), indium tin oxide (ITO), or the like.

In one or more embodiments, the conductive layer COa and the protective layer PAa may be formed of different materials. For example, the conductive layer COa may be formed of the first metal, and the protective layer PAa may be formed of the second metal that is different from the first metal. For example, the first metal may be aluminum (Al), and the second metal may be titanium (Ti). In other words, the protective layer PAa including titanium may be located on the conductive layer COa. Accordingly, the protective layer PAa may protect the conductive layer COa from corrosion.

In one or more embodiments, the conductive layer COa may be formed to have the first lower thickness HI1A, and the protective layer PAa may be formed to have the first upper thickness HI1B. The first lower thickness HI1A may mean a vertical distance between the top surface UD of the pixel-defining layer PDL and a top surface UCa of the conductive layer COa. The first upper thickness HI1B may mean a vertical distance between the top surface UCa of the conductive layer COa and a top surface UPa of the protective layer PAa.

However, the disclosure is not limited thereto. For example, the protective layer PAa may be omitted.

Figure 7:
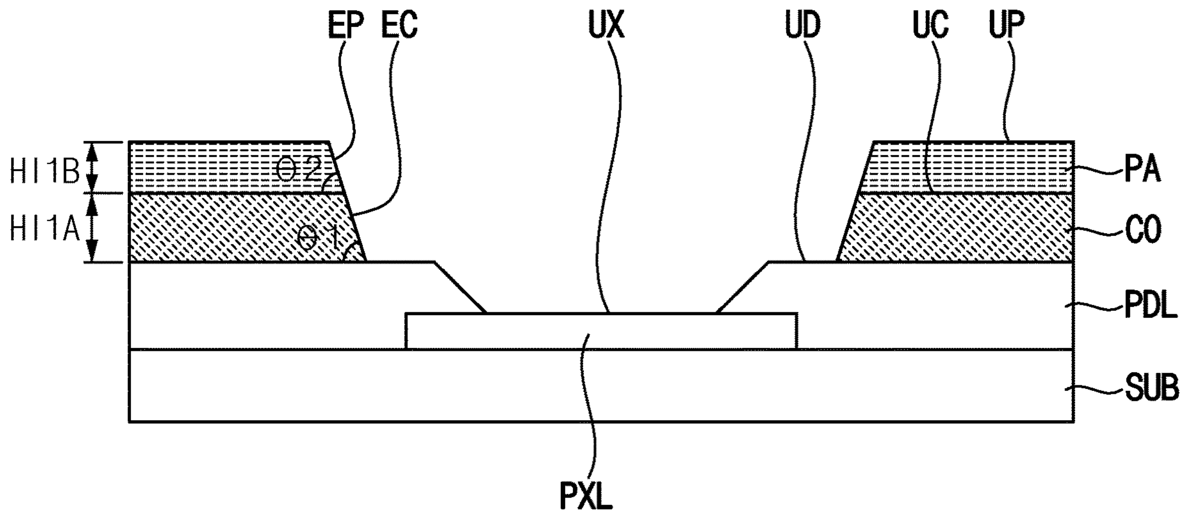

Referring to FIG. 7, the conductive layer COa and the protective layer PAa may be patterned concurrently or substantially simultaneously.

In one or more embodiments, the conductive layer COa and the protective layer PAa may be concurrently or substantially simultaneously patterned through a dry etching process. The dry etching process may be a process capable of removing a corresponding portion using a reactive gas, ions, or the like. The dry etching process may implement a finer pattern than a wet etching process in which the corresponding portion is removed by a chemical method using a solution.

Because the conductive layer COa and the protective layer PAa are concurrently or substantially simultaneously patterned, the taper angle of the conductive pattern CO may be the same as the taper angle of the protective pattern PA. For example, each of the conductive pattern CO and the protective pattern PA may have the regular taper shape. Accordingly, the first angle θ1 between the top surface UD of the pixel-defining layer PDL and the opposite sides EC of the conductive pattern CO may be an acute angle, and the second angle θ2 between the top surface of the conductive pattern CO and the opposite sides of the protective pattern PA may also be an acute angle. In addition, the second angle θ2 may be the same as the first angle θ1.

In one or more embodiments, the top surface UC of the conductive pattern CO may have the second width WD2. The second width WD2 may be less than the first width WD1. In other words, the width of the top surface UC of the conductive pattern CO (e.g., the second width WD2) may be less than the width of the top surface UD of the pixel-defining layer PDL (e.g., the first width WD1).

Figure 8:
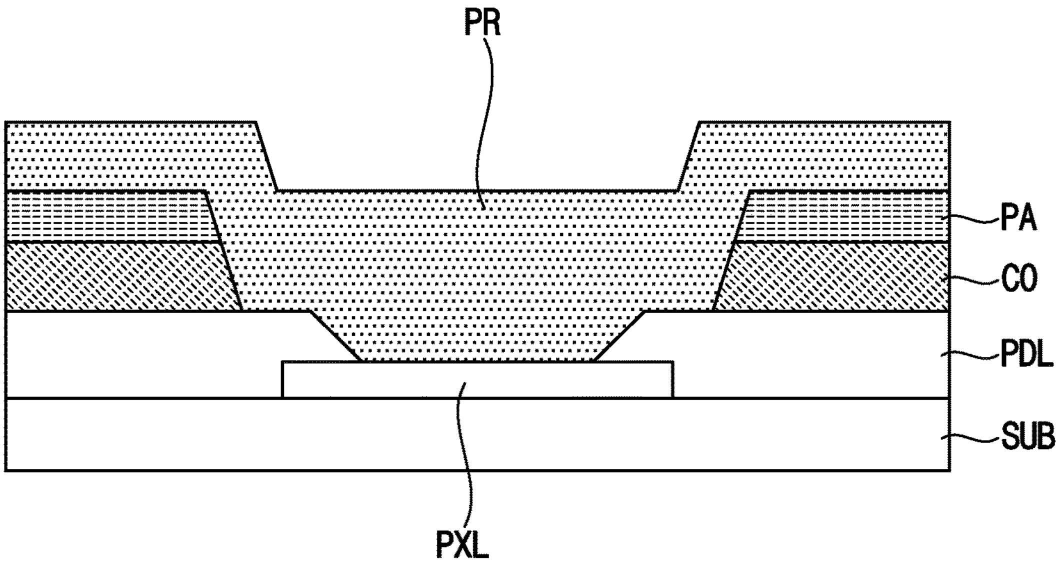

Referring to FIG. 8, a sacrificial layer PR may be formed on the conductive pattern CO.

In one or more embodiments, the sacrificial layer PR may be formed of an organic material. In one or more embodiments, the sacrificial layer PR may be formed of a photoresist. The photoresist has a property of causing chemical change by light, and may be suitably hardened or melted. Both negative type and positive type photoresists may be used. The negative type may remove a portion not exposed to light, and the positive type may remove a portion exposed to light. However, the disclosure is not limited thereto.

Figure 9:
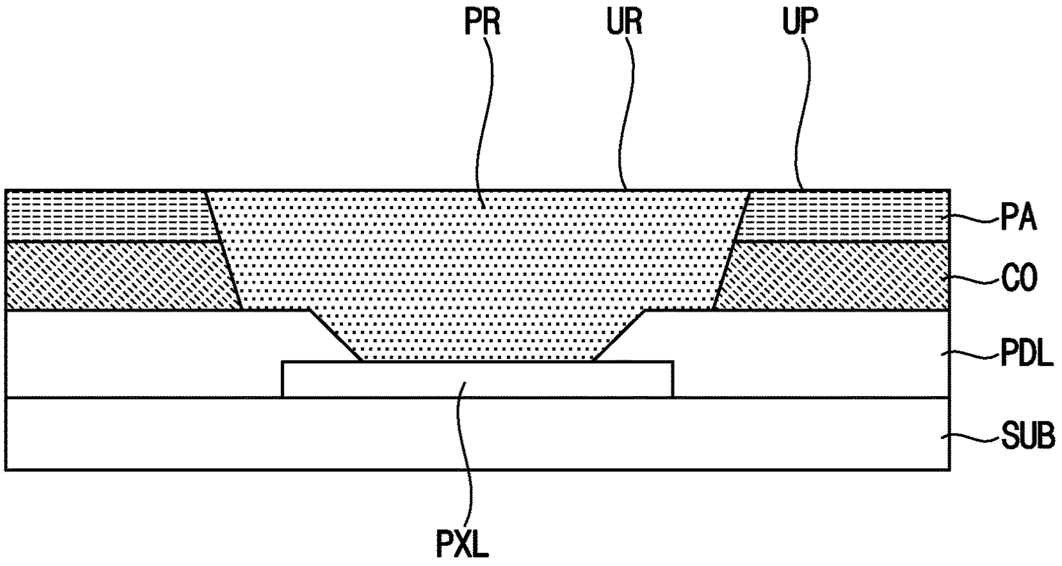

Referring to FIG. 9, the sacrificial layer PR may be planarized. For example, the sacrificial layer PR may be planarized so that a top surface UR of the sacrificial layer PR has a same level as the top surface UP of the protective pattern PA.

In one or more embodiments, the sacrificial layer PR may be planarized through a chemical mechanical polishing (CMP) process. The CMP process is a process of placing a polishing target on a plate rotating at high speed, and planarizing the sacrificial layer PR by applying pressure while providing a slurry to a polishing surface.

In one or more other embodiments, the sacrificial layer PR may be planarized through a photolithography process. The photolithography process is a process of planarizing the sacrificial layer PR by coating the photoresist, irradiating a light (exposure), and developing the photoresist into a desired shape (develop).

However, the disclosure is not limited thereto. For example, various methods, such as laser ablation, physical polishing or the like may be used to planarize the sacrificial layer PR.

Figure 10:
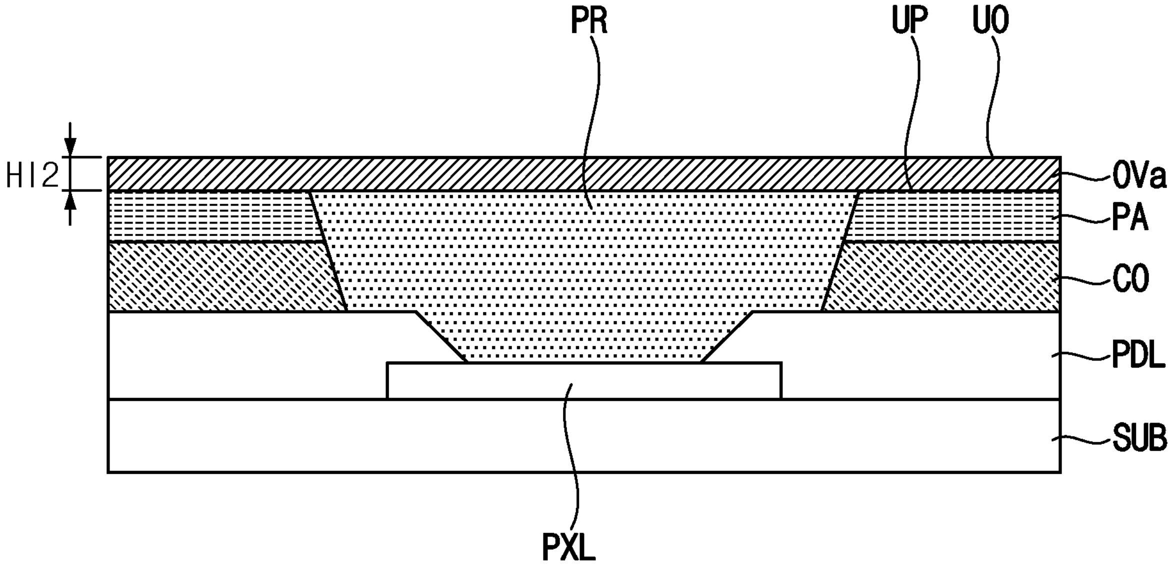
Figure 11:

Referring to FIGS. 10 and 11, a preliminary overhang layer OVa may be formed on the sacrificial layer PR.

The preliminary overhang layer OVa may be formed of inorganic material, metal, or the like.

In one or more embodiments, the preliminary overhang layer OVa may be formed of the inorganic material. Examples of the inorganic materials may include silicon nitride (SiNx), silicon oxide (SiOx), or the like.

In one or more other embodiments, the preliminary overhang layer OVa may be formed of metal. Examples of the metal may include titanium (Ti) or the like.

However, the disclosure is not limited thereto. The preliminary overhang layer OVa may be formed of a material that is resistant to damage that may occur in subsequent processes (e.g., the deposition process to form the organic layer EL, the sputtering process to form the second electrode CA, or the like) without restriction.

In one or more embodiments, the preliminary overhang layer OVa may have the second thickness HI2. The second thickness may mean a vertical distance between the top surface UPa of the protective layer PAa and the top surface of the preliminary overhang layer OVa. When the protective pattern PA is omitted, the second thickness may mean a vertical distance between the top surface of the conductive pattern CO and the top surface of the preliminary overhang layer OVa.

In one or more embodiments, the second thickness HI2 may be different form the first thickness. For example, the second thickness HI2 may be less than the first thickness. Here, the first thickness may be either the first lower thickness HI1A of the conductive pattern CO or the first upper thickness HI1B of the protective pattern PA.

For example, in the cross-sectional view, the first lower thickness HI1A of the conductive pattern CO or the first upper thickness HI1B of the protective pattern PA may be formed to about 2000 Å, and the second thickness HI2 of the preliminary overhang layer OVa may be formed to about 1000 Å. As the second thickness HI2 becomes less, the second electrode CA may be more suitably formed. A detailed description will be described later with reference to FIG. 15.

The preliminary overhang layer OVa may have various structures. In one or more embodiments, as shown in FIG. 10, the preliminary overhang layer OVa may be formed to have the mono-layer structure. As shown in FIG. 11, the preliminary overhang layer OVa may be formed to have the multi-layer structure. For example, the preliminary overhang layer OVa may include a layer formed of the first inorganic material OV1*a*, a layer formed of the metal OV2*a*, and a layer formed of the second inorganic layer OV3*a*. In this case, the display device may have the more robust structure than a display device including only the first inorganic material OV1*a* or a layer formed of the metal OV2*a*.

However, the disclosure is not limited thereto. The preliminary overhang layer OVa may be formed of to have various structures including a first layer including the inorganic material, a second layer including metal, or the like.

Figure 12:
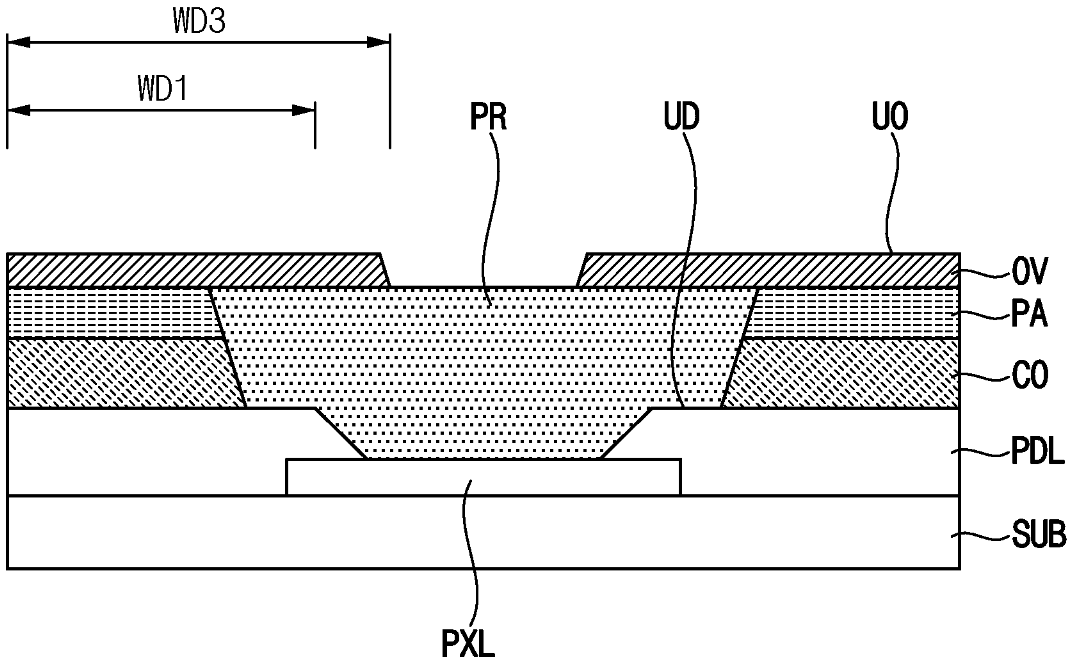

Referring to FIG. 12, the overhang layer pattern OV may be formed by patterning the preliminary overhang layer OVa. In one or more embodiments, the preliminary overhang layer OVa may be patterned by the dry etching process.

A detailed description of the dry etching process is described above with reference to FIG. 7.

The top surface UO of the overhang layer pattern OV may be formed to have the third thickness WD3. The third thickness WD3 may be greater than the first width WD1. In other words, the width of the top surface UO of the overhang layer pattern OV may be greater than the width of the top surface UD of the pixel-defining layer. Accordingly, the overhang layer pattern OV may serve as the tip (e.g. the tip TP of FIG. 13) that may be disconnected when forming the organic layer EL.

Figure 13:
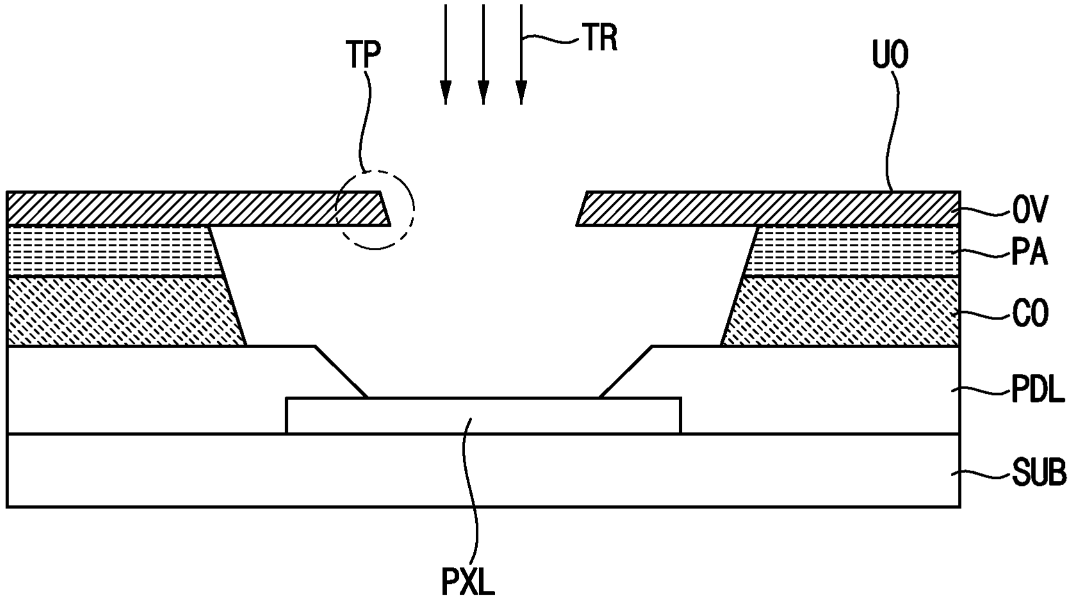

Referring to FIG. 13, after the forming of the overhang layer pattern OV, the sacrificial layer PR may be removed.

In one or more embodiments, the sacrificial layer PR may be removed through an ashing process. The ashing process may be a process of removing the photoresist using a plasma. The photoresist may be converted into volatile substances, such as water, carbon dioxide, or the like through the ashing process, and then removed.

However, the disclosure is not limited thereto. For example, the process of removing the sacrificial layer may be used as long as the method does not damage the tip TP.

Figure 14:
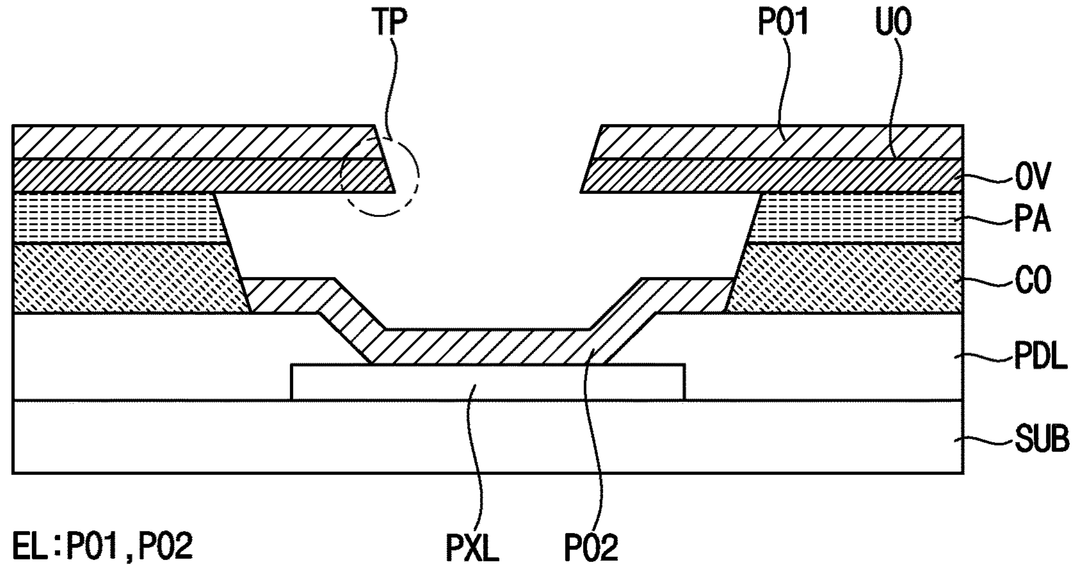

Referring to FIG. 14, the organic layer EL may be formed.

In one or more embodiments, the organic layer EL may be formed through the deposition process. In this case, the first portion PO1 of the organic layer EL and the second portion PO2 of the organic layer EL may have the disconnected structure due to the tip TP. For example, the organic layer EL may include the first portion PO1, and the second portion PO2 spaced apart from the first portion PO1. The first portion PO1 may be in contact with the top surface UO of the overhang layer pattern OV. The second portion PO2 may be in contact with both the first electrode PXL and the pixel-defining layer PDL. In other words, the first portion PO1 of the organic layer EL and the second portion PO2 of the organic layer EL may have the disconnected structure.

The organic layer EL may be formed of to include the light-emitting layer and the functional layer. The functional layer may include the hole transport layer, the hole injection layer, the electron injection layer, the electron transport layer, or the like. For example, the organic layer EL may include the hole transport layer, the hole injection layer, the light-emitting layer, the electron transport layer, and/or the electron injection layer. However, the disclosure is not limited thereto, and a stacking sequence or stacking formation may be changed.

Figure 15:
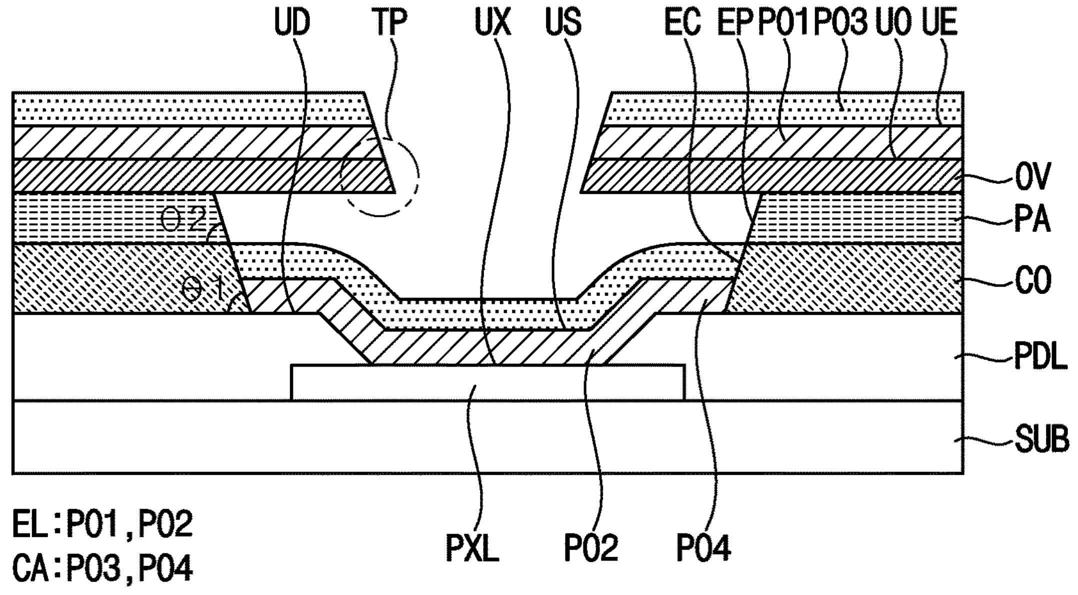

Referring to FIG. 15, the second electrode CA may be formed. In one or more embodiments, the first electrode maybe an anode and the second electrode maybe a cathode.

In one or more embodiments, the second electrode CA may be formed through the sputtering process. The sputtering process may be a process of depositing an atom protruding from a material on the substrate SUB by accelerating an ionized atom to collide with the material. The sputtering process may be faster than the evaporation deposition process, and may suitably control the thickness of the second electrode CA.

The second electrode CA may be formed of the transparent conductive material. For example, the second electrode CA may be formed of lithium (Li), calcium (Ca), aluminum (Al), silver (Ag), magnesium (Mg), barium (Ba), or the like. These may be used alone or in combination with each other.

The second electrode CA may include the third portion PO3 and the fourth portion PO4 spaced apart from the third portion PO3. The third portion PO3 of the second electrode CA may be in contact with the top surface UE of the first portion PO1 of the organic layer EL. The fourth portion PO4 may be in contact with both the top surface US of the second portion PO2 of the organic layer EL and the opposite sides EC of the conductive pattern CO. The second electrode CA may be connected across an entirety of a panel by contacting the opposite sides EC of the conductive pattern CO.

To contact the opposite sides EC of the conductive pattern CO, an incident angle of the material forming the second electrode CA may be greater than an incident angle of the material forming the organic layer EL relative to a normal line of the substrate SUB.

By forming the overhang layer pattern OV on the first electrode PXL having the smaller thickness than the conductive pattern CO, the limit of the deposition angle of the second electrode CA, which contacts the side wall, may become less.

The method of manufacturing the display device according to one or more embodiments of the disclosure may form the overhang layer pattern OV using the sacrificial layer PR including the organic material. The overhang layer pattern OV may act as the tip TP that may be disconnected the organic layer EL. A wet etching process may be omitted by forming the overhang layer pattern OV using the sacrificial layer PR. As a result, a gap between the pixel-defining layers PDL may be reduced or minimized to about 3 micrometers, thereby the number of pixels per inch (PPI) may be increased.

The method and the display device manufactured by the method according to the embodiments may be applied to a display device and the method of manufacturing the display device included in a computer, a notebook, a mobile phone, a smartphone, a smart pad, a PMP, a PDA, an MP3 player, or the like.

The above description is an example of aspects of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:

a substrate;

a first electrode above the substrate;

a pixel-defining layer above the substrate, defining an opening exposing a portion of a top surface of the first electrode, having a top surface having a first width, and comprising an inorganic material;

a conductive pattern above the pixel-defining layer, having a first thickness, and having a top surface having a second width that is less than the first width;

an overhang layer pattern above the conductive pattern, having a second thickness that is different from the first thickness, and having a top surface having a third width that is greater than the first width;

an organic layer comprising a first portion in contact with the top surface of the overhang layer pattern, and a second portion in contact with both the first electrode and the pixel-defining layer; and a second electrode comprising a third portion in contact with the top surface of the first portion of the organic layer, and a fourth portion spaced apart from the third portion and in contact with both the top surface of the second portion of the organic layer and opposite sides of the conductive pattern.

2. The display device of claim 1, wherein the second thickness is less than the first thickness.

3. The display device of claim 1, further comprising a protective pattern between the conductive pattern and the overhang layer pattern, and comprising a second metal that is different from a first metal of the conductive pattern.

4. The display device of claim 3, wherein the first metal comprises aluminum (Al), and the second metal comprises titanium (Ti).

5. The display device of claim 3, wherein a taper angle of the conductive pattern is substantially equal to a taper angle of the protective pattern.

6. The display device of claim 1, wherein the overhang layer pattern comprises an inorganic material.

7. The display device of claim 1, wherein the overhang layer pattern comprises a metal.

8. The display device of claim 1, wherein the overhang layer pattern comprises a multi-layer structure comprising a first layer comprising an inorganic material, and a second layer comprising a metal.

9. A method of manufacturing a display device, the method comprising:

forming a first electrode above a substrate;

forming a pixel-defining layer above the substrate, the pixel-defining layer defining an opening exposing a portion of a top surface of the first electrode, having a top surface having a first width, and comprising an inorganic material;

forming a conductive layer above the pixel-defining layer;

forming a conductive pattern having a first thickness, and having a top surface having a second width that is less than the first width by patterning the conductive layer;

forming a sacrificial layer comprising an organic material above the conductive layer;

planarizing the sacrificial layer;

forming a preliminary overhang layer having a second thickness that is different from the first thickness above the sacrificial layer;

forming an overhang layer pattern having a top surface having a third width that is greater than the first width by patterning the preliminary overhang layer;

removing the sacrificial layer;

forming an organic layer comprising a first portion in contact with the top surface of the overhang layer pattern, and a second portion in contact with both the first electrode and the pixel-defining layer; and forming a second electrode comprising a third portion in contact with the top surface of the first portion of the organic layer, and a fourth portion spaced apart from the third portion and in contact with both the top surface of the second portion of the organic layer and opposite sides of the conductive pattern.

10. The method of claim 9, wherein the second thickness is less than the first thickness.

11. The method of claim 9, further comprising, prior to the forming the conductive pattern, forming a protective layer above the conductive layer, the protective layer comprising a second metal that is different from a first metal of the conductive pattern.

12. The method of claim 11, wherein the first metal comprises aluminum (Al), and the second metal comprises titanium (Ti).

13. The method of claim 11, wherein the protective layer and the conductive layer are patterned through a dry etching process concurrently or substantially simultaneously.

14. The method of claim 9, wherein the sacrificial layer comprises photoresist.

15. The method of claim 9, wherein the preliminary overhang layer comprises at least one selected from a group consisting of an inorganic material and/or a metal.

16. The method of claim 15, wherein the preliminary overhang layer comprises a multi-layer structure having a first layer comprising an inorganic material, and a second layer comprising a metal.

17. The method of claim 9, wherein the sacrificial layer is planarized through a process of one of a chemical mechanical polishing (CMP) process, and a photolithography process.

18. The method of claim 9, wherein the preliminary overhang layer is patterned through a dry etching process.

19. The method of claim 9, wherein the sacrificial layer is removed through an ashing process.

20. The method of claim 9, wherein the first electrode comprises an anode, and wherein the second electrode comprises a cathode resulting from a sputtering process.

* * * * *